United States Patent
Chen et al.

(10) Patent No.: US 12,471,239 B2
(45) Date of Patent: Nov. 11, 2025

(54) CONTROLLING ELECTRIC FANS OF CABINET ASSEMBLIES

(71) Applicant: Quanta Computer Inc., Taoyuan (TW)

(72) Inventors: Yi-Chieh Chen, Taoyuan (TW); Yueh-Chang Wu, Taoyuan (TW); Te-Chuan Wang, Taoyuan (TW); Tzu-Hsuan Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 471 days.

(21) Appl. No.: 18/165,830

(22) Filed: Feb. 7, 2023

(65) Prior Publication Data
US 2024/0268057 A1    Aug. 8, 2024

(51) Int. Cl.
*H05K 7/20* (2006.01)
(52) U.S. Cl.
CPC ..... *H05K 7/20136* (2013.01); *H05K 7/20209* (2013.01)
(58) Field of Classification Search
CPC .......... H05K 7/20136; H05K 7/20209; H05K 7/20736; H05K 7/20836
See application file for complete search history.

(56) References Cited

U.S. PATENT DOCUMENTS

| | | | | |
|---|---|---|---|---|
| 5,544,012 A | * | 8/1996 | Koike | H05K 7/20572 165/122 |
| 2011/0207392 A1 | * | 8/2011 | Ebermann | H05K 7/20836 454/184 |
| 2017/0234330 A1 | * | 8/2017 | Kelaher | F04D 19/002 415/1 |
| 2018/0102124 A1 | * | 4/2018 | Huo | G10K 11/17823 |
| 2019/0361508 A1 | * | 11/2019 | Yarragunta | G05D 23/1931 |

* cited by examiner

*Primary Examiner* — Kidest Bahta
(74) *Attorney, Agent, or Firm* — NIXON PEABODY LLP

(57) ABSTRACT

An example assembly includes an equipment room, a cabinet fan module having fans, and a processor configured to execute logic. Temperature sensors are positioned in the air inlet channel and the equipment room. An electrical component having an air inlet area is also positioned in the equipment room. The logic causes the fans to operate at a predetermined speed, and compare a temperature in the air inlet channel with a temperature at the air inlet area. In response to determining that the temperature at the air inlet area is greater than the temperature in the air inlet channel plus a constant value, the operating speed of the fans is increased. Moreover, the operating speed of the fans is decreased in response to determining that the ambient temperature in the air inlet channel plus a constant value is greater than or equal to the temperature at the air inlet area.

20 Claims, 7 Drawing Sheets

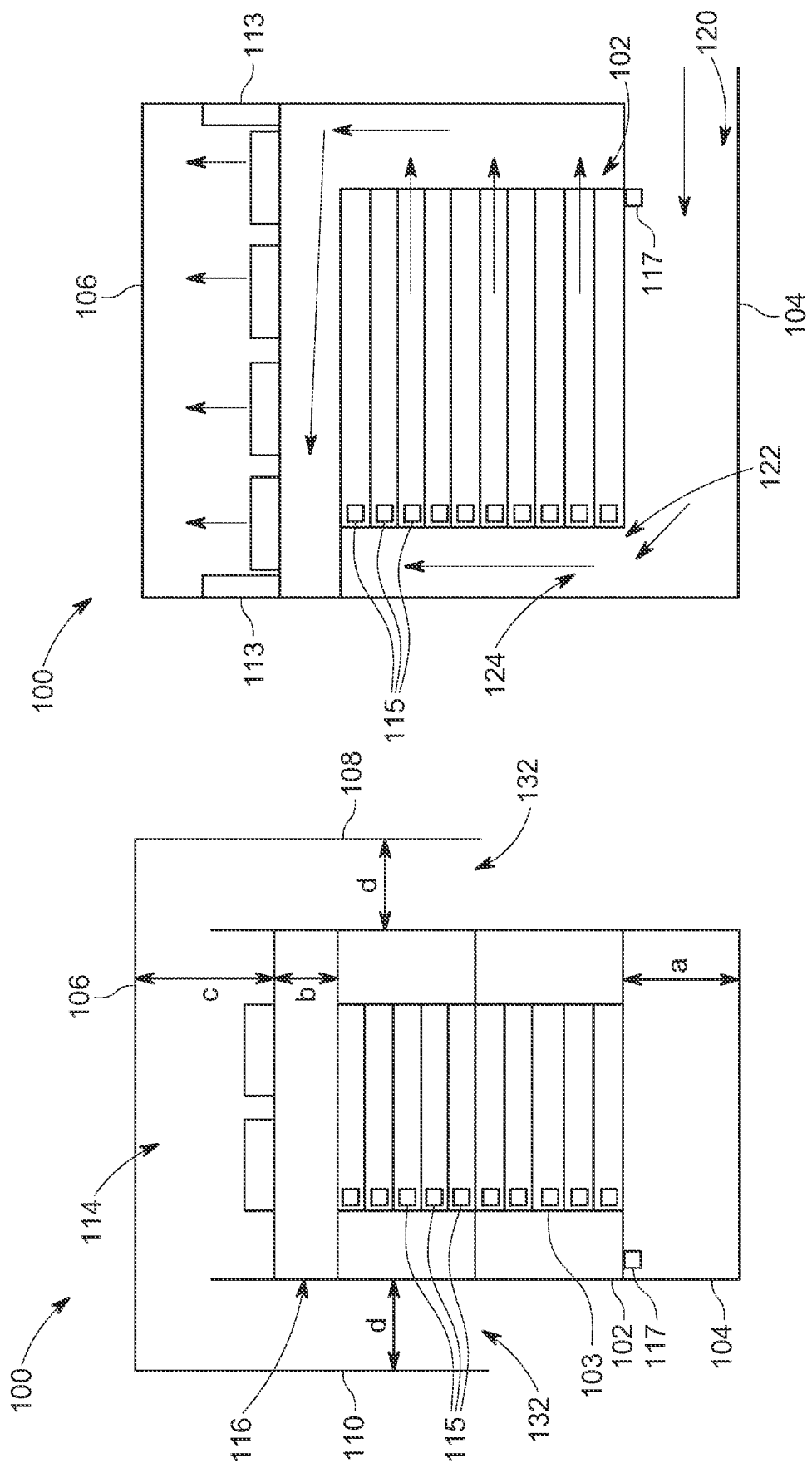

CONTROLLING ELECTRIC FANS OF CABINET ASSEMBLIES

TECHNICAL FIELD

The present disclosure relates generally to housing mechanisms for expansion components. More particularly, aspects of this disclosure relate to cabinet assemblies configured to provide cooling capacity and noise reduction for the devices therein.

BACKGROUND

Computer systems (e.g., desktop computers, blade servers, rack-mount servers, etc.) are employed in large numbers in various applications. High demand applications, such as network based systems, data centers, or high density finite element simulations that are able to push hardware of computing systems, require servers with specialized capabilities. Accordingly, modern servers are typically designed to allow flexibility in terms of capabilities and components.

Accordingly, compute architectures have changed over time. For instance, as computing throughputs increase, edge computing has been implemented in an attempt to reduce latency associated with accessing data over networks. Accordingly, servers that were originally located in data centers are being transitioned to user locations. While this design physically shortens the distance data travels, conventional implementations of such servers render them unfeasible at the user locations for other reasons.

Specifically, servers in data centers are designed to operate at a certain performance level. Sacrifices are often made in other areas in an effort to meet these performance capabilities, and as a result, a significant amount of noise is produced as a byproduct. This noise is caused by components like cooling fans operating at incredibly high revolutions per minute (RPMs), and baffling is minimized to increase airflow which further exacerbates the situation. While effective in terms of performance, it is not practical that these conventional servers be implemented in environments having any noise sensitivity, e.g., such as the majority of edge server applications.

Thus, there is a need for a configuration that is able to achieve significant heat dissipation while also minimizing the amount of noise produced as a result. Moreover, these heat and noise reductions must be made despite processing heavy input/output (I/O) loads received from various users, applications, etc.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

An example compute cabinet assembly for providing cooling capacity and noise reduction is disclosed. The compute cabinet assembly includes an equipment room configured to implement electrical components therein. The equipment room has a first side that is opposite a second side, the equipment room also having a third side extending between the first side and the second side. The compute cabinet assembly also includes an air inlet channel positioned adjacent to the first side of the equipment room, a cabinet fan module positioned adjacent to the second side of the equipment room, the cabinet fan module having electric fans therein, and an air outlet channel positioned adjacent to the cabinet fan module and extending along the third side of the equipment room. Temperature sensors are positioned in the air inlet channel and in the equipment room and an electrical component having an air inlet area is also positioned in the equipment room. The compute cabinet assembly further includes a processor for executing logic. The logic is configured to cause, by the processor, the electric fans to operate at a predetermined speed, receive, by the processor, temperature data from the temperature sensors, and compare, by the processor, an ambient temperature in the air inlet channel with a local temperature at the air inlet area. In some implementations, the predetermined speed is between about 20% and about 80% of a maximum operating speed of the electric fans, but could be higher or lower depending on the implementation. In response to determining that the local temperature at the air inlet area is greater than the ambient temperature in the air inlet channel, the operating speed of the electric fans is increased by a first predetermined amount. Moreover, in response to determining that the ambient temperature in the air inlet channel is greater than or equal to the local temperature at the air inlet area, the operating speed of the electric fans is decreased by a second predetermined amount.

In some implementations, the logic is also configured to maintain the operating speed of the electric fans in response to determining that: (i) the temperature at the air inlet area is less than or equal to the ambient temperature in the air inlet channel plus a constant value, and (ii) the temperature at the air inlet area is greater than the ambient temperature in the air inlet channel. In other implementations, the ambient temperature in the air inlet channel is an average of the temperature data received from the temperature sensors positioned in the air inlet. Moreover, the temperature at the air inlet area is an average of the temperature data received from the temperature sensor positioned at the air inlet area. In some implementations, the average of the temperature data received from the temperature sensors positioned in the air inlet is updated in a repeating fashion. For instance, the data may be updated between every about 0.1 seconds to every about 10 seconds, but could be higher or lower depending on the preferred implementation.

In some implementations, the electrical component positioned (e.g., implemented) in the equipment room includes a server, the server having at least one of the temperature sensors positioned at the corresponding air inlet area thereof. In further implementations, the equipment room is configured to receive a plurality of edge servers or high performance computing servers therein. In some implementations, the airflow path originates at the air inlet channel, extends through the equipment room and the cabinet fan module, and exits the compute cabinet assembly at the air outlet channel.

An example method for providing cooling capacity and noise reduction to a compute cabinet assembly, is also disclosed. The method includes causing electric fans in the foregoing compute cabinet assembly to operate at a predetermined speed. The method also includes receiving temperature data from temperature sensors positioned in the air inlet and in the equipment room, and comparing an ambient temperature in the air inlet channel with a local temperature at each respective air inlet of electrical components implemented in the equipment room. In response to determining that the local temperature at the air inlet of one of the electrical components is greater than the ambient temperature in the air inlet channel, the operating speed of the electric fans is increased by a first predetermined amount. Moreover, in response to determining that the ambient temperature in the air inlet channel is greater than or equal to the local temperature at each of the air inlets of the electrical components, the operating speed of the electric fans is decreased by a second predetermined amount.

An example computer program product for synchronously programming multiple memory modules is also disclosed. The computer program product includes a computer readable storage medium having program instructions embodied therewith. The program instructions are readable and/or executable by a processor to cause the processor to: perform the foregoing method.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 1B is a vertical cross-sectional view of the compute cabinet assembly of FIG. 1A, according to certain aspects of the present disclosure;

FIG. 1C is a vertical cross-sectional side view of the compute cabinet assembly of FIG. 1A, according to certain aspects of the present disclosure;

DETAILED DESCRIPTION

Figure 1A:
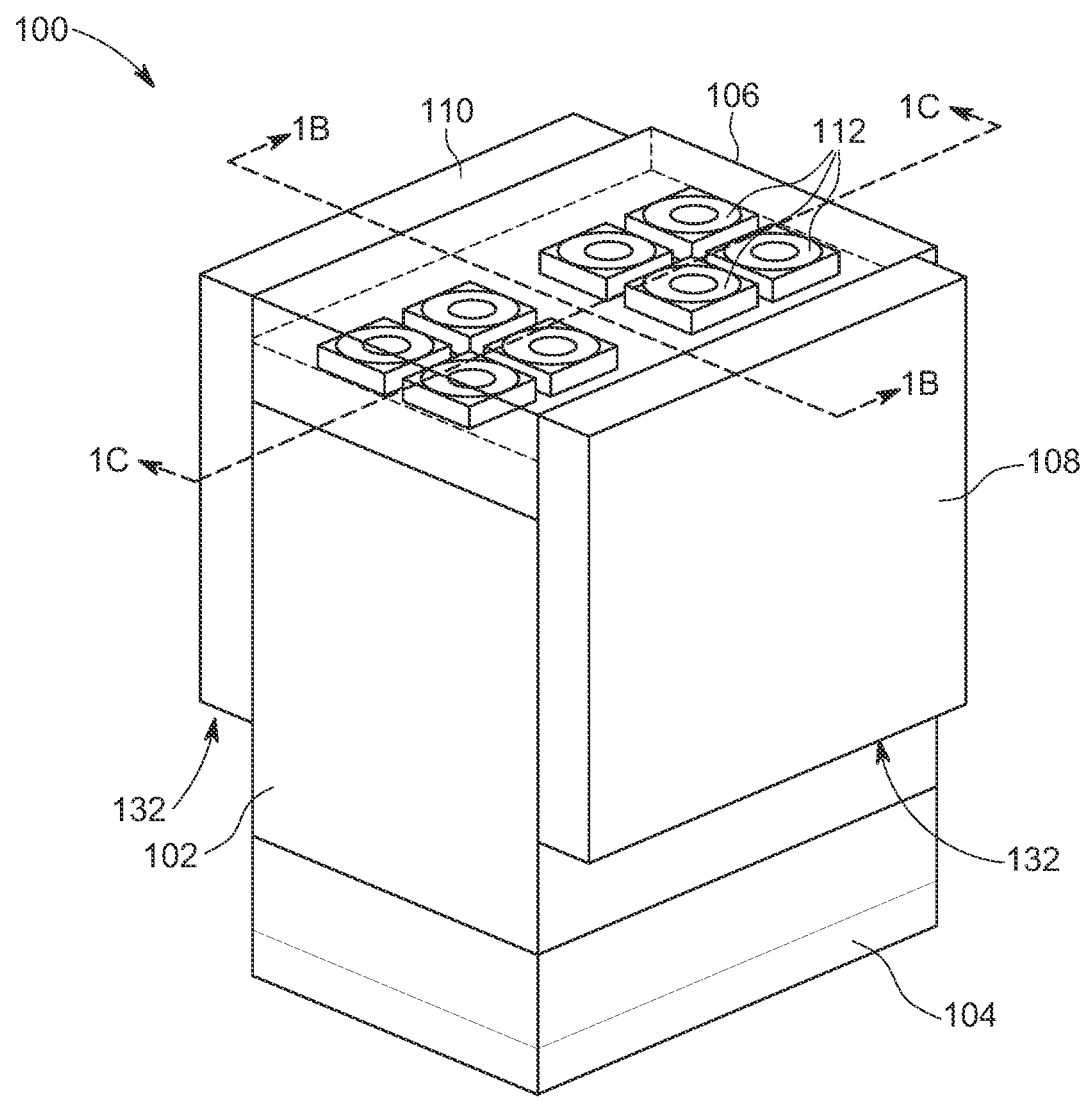
FIG. 1A is a perspective view of a compute cabinet assembly, according to certain aspects of the present disclosure.

The present disclosure is directed toward a compute cabinet assembly for providing cooling capacity and noise reduction is disclosed. The compute cabinet assembly includes an equipment room configured to implement electrical components therein. The equipment room has a first side that is opposite a second side, the equipment room also having a third side extending between the first side and the second side. The compute cabinet assembly also includes an air inlet channel positioned adjacent to the first side of the equipment room, a cabinet fan module positioned adjacent to the second side of the equipment room, the cabinet fan module having electric fans therein, and an air outlet channel positioned adjacent to the cabinet fan module and extending along the third side of the equipment room. Temperature sensors are positioned in the air inlet channel and in the equipment room and an electrical component having an air inlet area is also positioned in the equipment room. The compute cabinet assembly further includes a processor configured to execute logic. The logic is configured to cause, by the processor, the electric fans to operate at a predetermined speed, receive, by the processor, temperature data from the temperature sensors, and compare, by the processor, an ambient temperature in the air inlet channel with a local temperature at the air inlet area. In response to determining that the local temperature at the air inlet area is greater than the ambient temperature in the air inlet channel, the operating speed of the electric fans is increased by a first predetermined amount. Moreover, in response to determining that the ambient temperature in the air inlet channel is greater than or equal to the local temperature at the air inlet area, the operating speed of the electric fans is decreased by a second predetermined amount.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical", "horizontal", "parallel", and "perpendicular" are intended to additionally include "within 3-5% of" a vertical, horizontal, parallel, or perpendicular orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

As previously mentioned, compute architectures have changed over time. For instance, as computing throughputs increase, edge computing has been implemented in an attempt to reduce latency. Accordingly, servers that were originally located in data centers are being transitioned to user locations. While this design physically shortens the distance data travels, conventional implementations of such servers render them unfeasible at the user locations for other reasons.

Specifically, servers in data centers are designed to operate at peak performance, almost disregarding the amount of noise that is produced as a result. Thus, cooling fans are typically run at incredibly high revolutions per minute (RPMs) and baffling is minimized to increase airflow. While effective in terms of performance, these servers simply cannot be implemented in environments having any noise sensitivity. It follows that conventional servers are unsuited for implementation in a variety of settings, including those associated with edge computing.

In sharp contrast to these conventional shortcomings, various ones of the embodiments included herein are able to improve thermal efficiency and noise reduction without inhibiting I/O performance. In other words, the approaches herein are able to reduce the internal temperature and the noise profile of compute cabinet assemblies like edge servers or high performance computing (HPC) servers, e.g., such that they may be placed in a wider range of locations having greater noise sensitivities than typical server warehouses. However, this improved thermal transfer and noise reduction does not result in a corresponding reduction in performance, as typically experienced by conventional implementations. In fact, Inventors have verified with testing, that some of the approaches described herein are able to achieve heat dissipation along with removing ambient noise caused by the various electric fans and/or electrical components implemented therein. Again, this has been conventionally unachievable.

For instance, FIGS. 1A-1C, a compute cabinet assembly 100 that is capable of providing cooling capacity and noise reduction is illustrated in accordance with one embodiment. As an option, the present compute cabinet assembly 100 may be implemented in conjunction with features from any other embodiment listed herein, such as those described with reference to the other FIGS. However, such compute cabinet assembly 100 and others presented herein may be used in various applications and/or in permutations which may or may not be specifically described in the illustrative embodiments listed herein. Further, the compute cabinet assembly 100 presented herein may be used in any desired environment. Thus FIGS. 1A-1C (and the other FIGS.) may be deemed to include any possible permutation.

As shown, the compute cabinet assembly 100 includes an equipment room 102 configured to implement electrical components therein. The equipment room 102 may implement a variety of different electrical components and/or arrangements thereof depending on the implementation. For instance, the equipment room 102 may implement one or more servers in any desired configuration.

According to an example, the compute cabinet assembly 100 serves as an edge computing node. The equipment room 102 may thereby be configured to implement a plurality of edge servers and/or HPC servers therein, even at a user's location. This proximity to a data source allows for the compute cabinet assembly 100 and components therein to provide content caching, service delivery, persistent data storage, etc. As a result, at least some of the implementations included herein are able to achieve faster insights, improved response times, better bandwidth availability, etc., e.g., as will be described in further detail below.

An air inlet channel 104 is also shown as being coupled to a first side of the equipment room 102. Specifically, the air inlet channel 104 is depicted in the present embodiment as being directly coupled to a bottom surface of the equipment room 102, while the compute cabinet assembly 100 is positioned in an intended orientation. The compute cabinet assembly 100 also includes a cabinet fan module 106 coupled to a second side of the equipment room 102. Specifically, the cabinet fan module 106 is illustrated as being coupled directly to a top of the assembly 100. It follows that the air inlet channel 104 and cabinet fan module 106 are positioned on opposite sides of the compute cabinet assembly 100 in some implementations.

First and second air outlet channels 108, 110 are also illustrated as being positioned on opposite sides of the compute cabinet assembly 100. These air outlet channels 108, 110 are positioned such that at least a portion of the cabinet fan module 106 is coupled thereto. For instance, air outlets of the cabinet fan module 106 may connect directly to respective inlets of the air outlet channels 108, 110. The first and second air outlet channels 108, 110 are thereby preferably configured to direct airflow down the respective sides of the equipment room 102 and away from the cabinet fan module 106, e.g., as shown.

However, the channels 108, 110 may be configured differently depending on the implementation. For instance, the air outlet channels 108, 110 may be positioned on adjacent sides (surfaces) of the compute cabinet assembly 100. In other implementations, the assembly 100 may only include one air outlet channel (e.g., see FIG. 3 below), include three air outlet channels, four air outlet channels, five air outlet channels, etc.

The air inlet channel 104, cabinet fan module 106, and air outlet channels 108, 110 preferably work together (in combination) to allow air to enter the assembly 100. As a result, operating temperatures of the various components inside the assembly 100 may be cooled such that performance efficiency is improved. Moreover, this reduction in temperature does not involve the high noise levels that have plagued conventional implementations. Thus, the compute cabinet assembly 100 may be implemented in a variety of different operating settings without causing undesirable side effects. For example, the electric fans 112 may operate at a desired speed in an effort to maintain a particular operating temperature, e.g., as will be described in further detail below.

Looking specifically to FIG. 1C, the air inlet channel 104 is shown as having an inlet 120 that opens to the surrounding environment. The air inlet channel 104 thereby provides a pathway by which ambient air can enter the assembly 100 and travel therethrough. For instance, an airflow path preferably initiates at the inlet 120 of the air inlet channel 104, exits the air inlet channel 104 at an outlet 122 thereof, and enters the equipment room 102 at an inlet 124 thereof. The air carried along the airflow path is thereby able to interact with any compute components implemented in the equipment room 102 and cool them down before passing through the cabinet fan module 106 and exiting the assembly along air outlet channels 108, 110. It is thereby desirable that the air passes through the equipment room 102 in a substantially uniform manner. As a result, each of the compute components are cooled at a similar rate, thereby ensuring that the compute cabinet assembly 100 remains operational.

While the air carried along the airflow path may enter the equipment room 102 through an arbitrary opening (e.g., inlet 124) in some implementations, the air carried along the airflow path may transition through the equipment room 102 more desirably (e.g., uniformly) in response to certain dimensions and/or features being implemented at the inlet 124 to the equipment room 102. This allows for air carried along the airflow path to travel through the equipment room 102 more uniformly, thereby causing better heat dissipation, improved operating conditions (e.g., a higher achievable processing throughput) for the assembly 100, etc. It follows that the compute cabinet assembly 100 is preferably configured to uniformly distribute (e.g., direct, disperse, etc.) airflow path through the equipment room 102. In other words, compute cabinet assembly 100 is preferably designed to ensure that each of the electrical components 103 in the equipment room 102 receive about a same airflow flowrate (e.g., airflow potential).

While the arrangement and/or dimensions of the different portions of the compute cabinet assembly 100 may impact the airflow flowrate through each of the electrical components 103 in the equipment room 102, air speed also has an impact. For instance, as air speed along the airflow path increases, the airflow flowrate through each of the electrical components 103 may increase as well. However, this linear relationship may not be true for all air speeds. Speeds outside a predetermined range (e.g., above a predetermined value) may actually increase the amount of backflow experienced in the compute cabinet assembly 100. However, if the air speed is too low, the electrical components 103 may not receive enough airflow therethrough and overheat as a result.

For instance, one or more guide plates, blocking plates, adjustable (e.g., selectively positionable) baffles, etc., may be positioned as desired in the compute cabinet assembly 100. For example, one or more guide plates may be used to direct an airflow path as it enters the equipment room 102. Moreover, one or more blocking plates may be positioned in the equipment room 102. The guide plates and/or the blocking plates may be used to reduce airflow backflow. The airflow backflow may be caused by several different contributing factors. For instance, the airflow backflow may be caused by the electrical components (e.g., fans inside server modules), the geometry of the interior of the assembly 100, air speeds, etc. For instance, as hot air that has absorbed some of the thermal energy produced by the electrical components 103 exits the electrical components 103, it is urged towards the outlet of the equipment room 102 rather than back towards the inlet 124. It follows that guide plates and/or blocking plates may improve the thermal regulation capabilities of the compute cabinet assembly 100 in some implementations.

While guide plates and/or blocking plates may provide some improved thermal regulation capabilities, these improvements are somewhat dependent on ambient air that is drawn into the assembly 100. As noted above, air that passes through the electrical components 103 absorbs some of the thermal energy produced by the electrical components 103, carrying it out of the equipment room 102, through the cabinet fan module 106, and exiting the assembly along air outlet channels 108, 110. The speed of the airflow, temperature of the air in the airflow, etc., thereby has an impact on the achievable thermal capabilities of the assembly 100.

For instance, the speed of the airflow (i.e., the speed by which air is moving along the airflow path) may be determined based on the operating speed(s) of the electric fans 112 and/or electric fans in the electrical components 103 in the equipment room 102. In other words, the electric fans 112 and/or electric fans in the electrical components 103 in the equipment room 102 may be controlled to operate at one or more desired speeds in an effort to maintain a particular operating temperature in the assembly 100.

For instance, the airflow path may extend directly through the electrical components 103 (e.g., servers), and exit the equipment room 102. It follows that in some implementations, the contribution of the cabinet fans towards the total airflow in the assembly 100 is less than the contribution of the fans included in the servers towards the total airflow. However, the fans included in the servers may contribute more towards the total airflow in other implementations. Various ones of the implementations included herein may be used to determine and achieve certain airflow characteristics that improve the performance capabilities of the assembly 100, e.g., as will be described in further detail below with respect to method 500 of FIG. 5.

It follows that various ones of the implementations included herein are able to significantly improve characteristics of the airflow path that is formed in the assembly 100. This desirably improves thermal regulation and allows for the electrical components included therein to operate in a wider range of activation states without creating an undesirably high internal temperature of the compute cabinet assembly 100. The electrical components 103 in the equipment room are thereby able to operate as needed rather than in a throttled manner as seen in conventional implementations that have been unable to achieved similar results to the various approaches included herein.

Other factors may also impact characteristics of the airflow path. For instance, the air inlet channel 104 is preferably designed to allow for a desired amount (e.g., volume) of air to enter an interior of the assembly 100. This desired amount of air may vary depending on the number of components included in the assembly 100, the intended use of the assembly 100, a size of the assembly 100, the interior configuration(s) of the assembly 100, etc. The dimensions of the various portions of the compute cabinet assembly 100 may thereby vary depending on the implementation. For instance, the electric fans 112 and/or electric fans in the electrical components 103 in the equipment room 102 may be calibrated based on the amount (e.g., volume) of the air inlet channel 104 is configured to provide the inlet of the equipment room 102. Similarly, the electric fans 112 and/or electric fans in the electrical components 103 in the equipment room 102 may be calibrated based on the amount (e.g., volume) and direction of the air as it passes through the equipment room 102 along the airflow path.

FIG. 1B indicates a number of specific dimensions that may be adjusted, e.g., to produce the desired amount of airflow through the assembly 100. These dimensions may be "adjusted" in the sense that they can be set during manufacture of the physical assembly 100 and its various portions. As shown, the width "d" of the air outlet channels 108, 110 may be adjusted to control an amount of air that leaves the assembly 100. According to an exemplary range, the width "d" of either air outlet channel 108, 110 may be between about 8.89 centimeters (cm) and about 26.67 cm, but could be higher or lower as desired. Moreover, the air outlet channels 108, 110 may have the same, similar, or different dimensions depending on the approach. Furthermore, the height "a" of the air inlet channel 104 may be between about 13.34 cm and about 31.12 cm, but could be higher or lower depending on the desired implementation.

The cabinet fan module 106 is shown as being divided into a first section 114 and a second section 116. The first section 114 includes the plurality of electric fans 112 and at least one fan controller 113, while the second section 116 is adjacent thereto. The second section 116 allows for air to fully exit the equipment room 102 and be drawn in by each of the electric fans 112. Moreover, the fan controllers 113 preferably control one or more operating settings of the electric fans 112. For example, the fan controllers 113 may be able to increase, decrease, or maintain the current operating speed of each electric fan 112 to achieve a desired airflow.

Figure 1D:
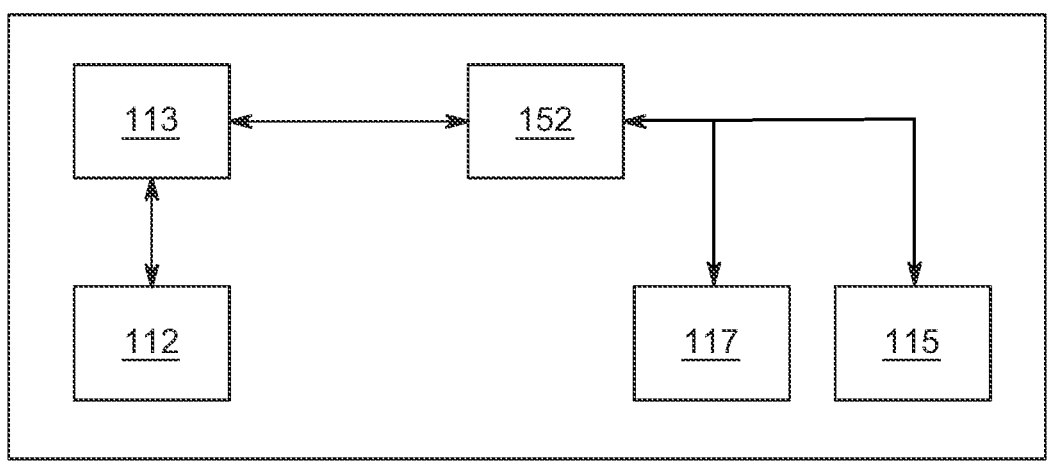
FIG. 1D is a representational view of a signal diagram, according to certain aspects of the present disclosure.

Referring momentarily now to FIG. 1D, a representational view of a signal diagram 150 is illustrated in accordance with one implementation. As an option, the present signal diagram 150 may be implemented in conjunction with features from any other embodiment listed herein, such as those described with reference to the other FIGS., such as FIGS. 1A-1C. However, such signal diagram 150 and others presented herein may be used in various applications and/or in permutations which may or may not be specifically described in the illustrative embodiments listed herein. Further, the signal diagram 150 presented herein may be used in any desired environment. Thus FIG. 1D (and the other FIGS.) may be deemed to include any possible permutation.

As shown, the signal diagram 150 includes the temperature sensors 115, 117 which may be positioned in a cabinet assembly. The temperature sensors 115, 117 are electrically coupled (e.g., wired and/or wirelessly) to a remote modular controller (RMC) 152. Accordingly, temperature information may be sent from temperature sensors 115, 117 to the RMC 152. The RMC 152 is electrically coupled to a fan controller 113. The fan controller 113 may actually cause the operating settings of the electric fans 112 to change, e.g., as would be appreciated by one skilled in the art after reading the present description. It follows that instructions, data, metadata, requests, commands, etc. may be sent between any of the locations included in the signal diagram 150 of FIG. 1D.

Returning now to FIG. 1B, the dimensions of the first and second sections 114, 116 also impacts airflow through the whole assembly 100. For instance, the height "c" of the first section 114 of the cabinet fan module 106 may also be adjusted. By adjusting the height "c" of the first section 114, the electric fans 112 may be able to create more or less air pressure, thereby leading to larger or smaller airflows, respectively. According to another exemplary range, the height "c" of the first section 114 of the cabinet fan module 106 may be between about 4.45 cm and about 17.78 cm. Moreover, the height "b" of the second section 116 may be adjusted to allow for more or less air to be provided to the various electric fans 112. According to an exemplary range, the height "b" of the second section 116 of the cabinet fan module 106 may be between about 4.45 cm and about 17.78 cm.

While certain dimensions have been indicated in FIG. 1B, these are in no way intended to be limiting. Any other dimensions or aspects of the compute cabinet assembly 100 may be adjusted as desired. It should also be noted that the relative orientation of the dimensions described with respect to FIG. 1B are in no way intended to be limiting. Thus, while dimension "a" is described above as a height, this is in no way intended to limit the invention. For example, if the air inlet channel were to be implemented in a different orientation, position, environment, etc., the dimension "a" may be referenced as a width, thickness, length, etc., or any other equivalent measurement.

The inlet 120 of the air inlet channel 104 may be free of any obstructions in some approaches. In other words, the inlet 120 of the air inlet channel 104 may be configured to permit a maximum amount of air into the assembly 100. In other approaches however, the inlet 120 of the air inlet channel 104 may implement an air filter configured to remove contaminates from the ambient air that is drawn into the assembly 100 and/or some other type of component that at least partially blocks airflow from entering. An outlet 122 of the air inlet channel 104 may also be configured differently depending on the approach.

As noted above, the outlet 122 of the air inlet channel 104 opens directly to the equipment room 102. Ambient air taken in by the air inlet channel 104 is thereby allowed to enter and pass through the equipment room 102. This allows for the various electrical components 103 included in the equipment room 102 to operate without overheating by achieving a thermal exchange with the air being passed through the electrical components, e.g., as would be appreciated by one skilled in the art after reading the present description. Moreover, controlling the speeds of the electric fans 112 and/or fans in the electrical components 103 as described herein is able to maintain a desirable airflow path by removing airflow backflow therefrom. As noted above, by preventing air to feed back to air inlets of the electrical components 103, thermal efficiency increases significantly, causing the achievable throughput of the assembly 100 as a whole (and electrical components 103 included therein) to be increased.

For instance, looking again specifically to FIG. 1C, the arrowed lines demonstrate that ambient air is drawn into the air inlet channel 104 before entering the equipment room 102. There, the ambient air flows through each of the electrical components 103 and/or physical bays that are configured to implement (e.g., hold) the various electrical components 103 of the equipment room 102. Heat generated by the electrical components 103 in the equipment room 102 may thereby be transferred to the cooler ambient air passing through, before being carried into the cabinet fan module 106. There, heat generated by the electric fans 112 and/or any other electrical components in the cabinet fan module 106 may also be absorbed before eventually exiting through outlets of the cabinet fan module 106, each outlet being connected (e.g., aligned and functionally coupled to) inlets of the air outlet channels 108, 110. The heat from the equipment room 102 and/or cabinet fan module 106 is removed from the assembly 100 at outlets of the air outlet channels 108, 110. The inlets and the outlets of the air outlet channels 108, 110 are thereby configure the airflow path such that airflow is directed from the first and second air outlet channels 108, 110 to the respective sides of the equipment room 102 and away from the cabinet fan module 106.

It may also be desirable that the assembly 100 is implemented in environments having a lower ambient temperature than an average operating temperature in the equipment room 102. In other words, the assembly 100 is preferably able to draw in ambient air that has a lower temperature than the air in the equipment room 102, e.g., during operation of the electrical components therein and/or the electric fans 112. In some implementations, the assembly 100 may even be configured to condition (e.g., cool, dehumidify, etc.) air before it is used to cool the temperature in the equipment room, and thereby the electrical components therein.

Electric fans 112 positioned in the cabinet fan module 106 are used to at least partially generate the airflow that passes through the compute cabinet assembly 100. In other words, the electric fans 112 are preferably configured to create airflow originating at the inlet 120 of the air inlet channel 104, extending through the equipment room 102 and cabinet fan module 106, finally exiting the compute cabinet assembly 100 at the outlets 132 of the first and second air outlet channels 108, 110.

As noted above, in some implementations the electric fans 112 are controlled by a processor or other type of computing device (e.g., a controller) to create this airflow. Accordingly, the electric fans 112 may be turned on to create the airflow or off to stop the airflow, by a processor that is able to determine whether to supply the electric fans 112 with a supply voltage. In other implementations, the electric fans 112 may receive instructions from a processor, and these instructions may be implemented in the electric fans 112 by a processor (e.g., microcontroller) included therein that controls motors that are able to actually rotate the electric fans 112 to create the airflow, or stop them from rotating off to end the airflow.

For instance, the positive and negative pressures formed by the electric fans 112 while operating (e.g., rotating) create a bias that draws ambient air in through the air inlet channel 104, pushes the ambient air through the equipment room 102, and out through the air outlet channels 108, 110. The orientation and/or amplitude of the air pressures formed by the electric fans 112 may be selectively adjusted by changing the dimensions (e.g., pitch, length, thickness, etc.) of the physical blades in the electric fans 112, the operating speed of the electric fan(s) 112, the orientation of the electric fans 112, the direction in which blades of the electric fans 112 rotate, etc. It follows that the specific amount of airflow that is desired for a given situation may be achieved.

According to a specific example, which is in no way intended to limit the invention, the compute cabinet assembly 100 functions as an edge server, a HPC server, or any other type of server that would be apparent to one skilled in the art. Over time, this server may be faced with different workloads and therefore will be throttled between different throughput levels, causing the electrical components therein to experience a range of operating settings. The operating speed of the electric fans 112 may thereby be ramped up and down to achieve a sufficient airflow for the electrical components in the compute cabinet assembly 100 to be cooled properly while also reducing power consumption and operating noise.

The electric fans 112 may thereby communicate with one or more sensors positioned throughout the compute cabinet assembly 100. For instance, temperature sensors 115 may be positioned throughout the equipment room 102 and relay temperature-based information to a processor that controls the operating settings of the various electric fans 112. The temperature sensors 115 may be positioned adjacent to the air inlets of the servers positioned in the equipment room 102. Similarly, temperature sensors 117 positioned in the air inlet channel 104 may identify the temperature of the incoming ambient air which indicates the cooling capacity of the ambient air. The operating settings of the electric fans 112 may thereby be adjusted based on how effective the ambient air is at absorbing heat from the equipment room 102, e.g., as would be appreciated by one skilled in the art after reading the present description.

In some implementations, operating settings of the electric fans 112 may be determined based on the various electrical components 103 in the equipment room 102. For instance, the compute cabinet assembly 100 may function as an edge server, a HPC server, or any other type of server. As noted above, electric fans included in servers may have an impact on an airflow throughout a compute cabinet assembly. The operating conditions of electrical components 103 in the equipment room 102 are thereby taken into consideration in some implementations while controlling the operating settings of the electric fans. In other words, the process of controlling operating settings of the electric fans 112 is based on how the servers (e.g., electrical components 103) are operating. For example, an operating speed of the electric fans 112 may be increased by a predetermined amount in response to determining that the servers are operating at 50% or more of a maximum achievable throughput. The operating speed of the electric fans 112 may also be decreased based on how the servers (e.g., electrical components 103) are operating. For example, an operating speed of the electric fans 112 may decrease by a predetermined amount in response to determining that the servers are operating at 50% or less of a maximum achievable throughput, e.g., as will soon become apparent.

It follows that depending on the configuration and/or operating settings of the electric fans 112, they may produce a significant amount of noise and/or turbulence along the airflow path in some situations. As noted above, conventional implementations have been unable to improve thermal regulation without sacrificing performance capabilities. In sharp contrast, various ones of the implementations included herein are able to maintain high amounts of thermal capacity without impacting performance levels.

Moreover, some implementations can significantly reduce the amount of noise that is produced by the assembly 100 as a whole. These acoustic improvements are achieved at least in part by the relative positions of the various portions of the compute cabinet assembly 100. For instance, by positioning the equipment room 102 towards a center of the assembly 100 with the air inlet channel 104, cabinet fan module 106, and air outlet channels 108, 110 generally surrounding it, the noise produced by the electrical components (e.g., servers) in the equipment room 102 and the electric fans 112 are confined within the assembly 100 and absorbed before entering the surrounding environment. Accordingly, it is desirable that the air outlet channels 108, 110 are partially coupled to the cabinet fan module 106 and extend along the sides of the equipment room towards the outlets 132.

With continued reference to FIGS. 1A-1C, the acoustic profile of the compute cabinet assembly 100 may further be improved by implementing one or more noise absorbing barriers and/or noise isolation barriers. A noise absorbing barrier is preferably configured to at least partially absorb sound (i.e., soundwaves) produced by components in the assembly 100. This may be accomplished by converting some of the energy in the audible noise to heat that is absorbed. Accordingly, it may be advantageous to place noise absorbing barriers near entrances and exits of the compute cabinet assembly 100 to prevent noise from exiting. For example, noise absorbing barriers may be applied to one or more interior surfaces of the air inlet channel 104 and/or the air outlet channels 108, 110.

On the other hand, a noise isolation barrier (e.g., noise insulation) may be used to restrict sound from travelling between separate spaces through shared surfaces, e.g., such as walls, ceilings, floors, etc. Accordingly, it may be advantageous to place noise isolation barriers near noise sources in the compute cabinet assembly 100 to prevent noise from escaping from these specific portions or compartments. For example, noise isolation barriers may be applied to one or more interior surfaces of the equipment room 102 and/or the air outlet channels 108, 110.

Figure 2A:
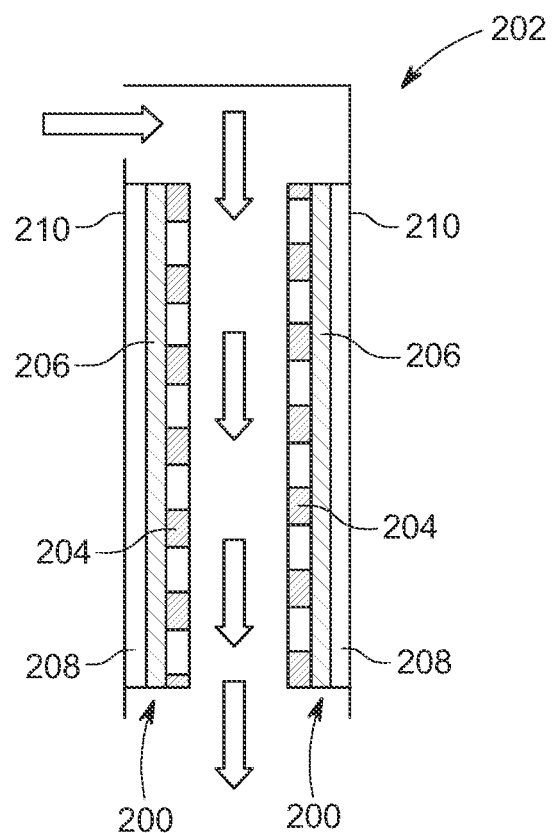
FIG. 2A is a cross-sectional view of a channel having air absorbing barriers applied to interior surfaces thereof, according to certain aspects of the present disclosure.
Figure 2B:
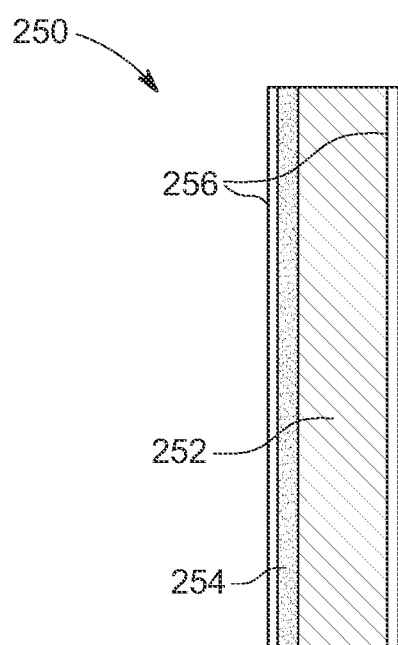
FIG. 2B is a cross-sectional view of an air isolation barrier, according to certain aspects of the present disclosure.

Referring momentarily now to FIGS. 2A-2B, noise absorbing barriers 200 and a noise isolation barrier 250 are illustrated in accordance with certain embodiments. As an option, the present barriers 200, 250 may be implemented in conjunction with features from any other embodiment listed herein, such as those described with reference to the other FIGS., such as FIGS. 1A-1C. However, such barriers 200, 250 and others presented herein may be used in various applications and/or in permutations which may or may not be specifically described in the illustrative embodiments listed herein. Further, the barriers 200, 250 presented herein may be used in any desired environment. Thus FIGS. 2A-2B (and the other FIGS.) may be deemed to include any possible permutation.

Looking specifically to FIG. 2A, the noise absorbing barriers 200 are illustrated as being positioned on opposite sidewalls (e.g., sides) of a channel 202. Accordingly, the noise absorbing barriers 200 may be applied to all interior surfaces of a given component. For instance, noise absorbing barriers 200 may be applied to all interior surfaces of air inlet and/or outlet channels.

A noise absorbing barrier 200 includes a plate layer 204 coupled to a noise absorbing layer 206. In some implementations, the plate layer 204 may be coupled directly to the noise absorbing layer 206. In other words, there may not be any intermediate layers positioned between the plate layer 204 and the noise absorbing layer 206. Despite not having any intermediate layers therebetween, the plate layer 204 and noise absorbing layer 206 may be directly coupled to each other using one or more adhesives applied to coupled surfaces of the respective layers 204, 206. In other approaches, the plate layer 204 may be coupled to the noise absorbing layer 206 using one or more fasteners, clamps, brackets, magnets, etc.

The plate layer 204 is preferably a perforated plate having a plurality of holes extending therethrough. In other words, the plate layer 204 includes a piece of material (e.g., metal) having different hole sizes, shapes, patterns, etc., that have been formed through the piece of material. For example, the plate layer 204 may include material having evenly spaced holes formed therethrough, the holes having an inner diameter of between about 0.01 mm and about 10 mm, but could be higher or lower. Depending on the approach, these holes may have been formed manually, mechanically (e.g., stamped or punched), using laser cutting, etc. Accordingly, the plate layer 204 is depicted in FIG. 2A as having alternating crosshatching to indicate the various holes that extend through the layer 204.

Depending on the approach, the plate layer 204 may include aluminum, steel, stainless steel, gypsum, etc., or another type of desired material. The noise absorbing layer 206 may also include different materials depending on the implementation. For instance, the noise absorbing layer 206 may include foam, rockwool, glasswool, etc., or any other type of material that is able to absorb sound (e.g., convert sound into heat) and which would be apparent to one skilled in the art after reading the present description.

The noise absorbing layer 206 is further separated from the outer noise isolation layer 210 of the channel 202 by an air layer 208. In some approaches, the air layer 208 is enclosed (e.g., sealed) such that air is trapped in a confined volume between the noise absorbing layer 206 and the outer noise isolation layer 210. The air included in an enclosed air layer may include specific gasses (e.g., molecules), be pressurized, kept at a predetermined temperature, etc. In other approaches, the air layer 208 is not enclosed (e.g., is open), allowing for air to pass therethrough.

While the plate layer 204 in combination with the noise absorbing layer 206 and air layer 208 significantly reduce noise, the noise isolation layer 210 may serve to further prevent any remaining noise from escaping through the sidewalls of the channel 202. Accordingly, the noise isolation layer 210 preferably includes a type or rubber, e.g., such as ethylene propylene diene monomer (EPDM), or any other material that is capable of effectively blocking (e.g., insulating) soundwaves from passing therethrough. The noise isolation layer 210 may also have a thickness of between about 1 mm and about 3 mm, but could be higher or lower depending on the approach.

It should also be noted that while the noise absorbing barrier 200 is illustrated in FIG. 2A as having the above configuration, this is in no way intended to be limiting. For instance, in other implementations, a noise absorbing barrier may include only a noise absorbing layer and a noise isolation layer. In other implementations, a noise absorbing barrier may include a noise isolation layer separated from a patterned plate layer by an air barrier. In still other implementations, a noise absorbing barrier may include a noise isolation layer, separated from a patterned plate layer by a noise absorbing layer. It follows that various combinations of the layers described herein may be combined to create various structures that may be used to coat the surfaces of compute cabinet assemblies as desired.

Looking now to FIG. 2B, the noise isolation barrier 250 includes a noise absorbing layer 252, and a noise isolation layer 254, these layers 252, 254 being sandwiched between outer walls 256. In some implementations, the noise absorbing layer 252 and noise isolation layer 254 may be coupled directly to each other. In other words, there may not be any intermediate layers positioned between the noise absorbing layer 252 and noise isolation layer 254. Despite not having any intermediate layers therebetween, the noise absorbing layer 252 and noise isolation layer 254 may be directly coupled to each other using one or more adhesives applied to coupled surfaces of the respective layers 252, 254. In other approaches, the noise absorbing layer 252 may be coupled to and noise isolation layer 254 using one or more fasteners, clamps, brackets, magnets, etc.

The noise absorbing layer 252 and noise isolation layer 254 may further implement any of the approaches above with respect to layers 206 and 210, respectively. Accordingly, the noise absorbing layer 252 may include foam, rockwool, glasswool, etc., or any other type of material that is able to absorb sound (e.g., convert sound into heat) and which would be apparent to one skilled in the art after reading the present description. The noise isolation layer 210 may include a type or rubber, or any other material that is capable of effectively blocking (e.g., insulating) soundwaves from passing therethrough. Moreover, the outer walls 256 may include any desired type of metal, plastic, etc.

It follows that the barriers depicted in FIGS. 2A-2B are desirably able to reduce the amount of noise that is in a given environment. For instance, applying noise absorbing barriers and/or noise isolation barriers to the surfaces of a compute cabinet assembly (e.g., see compute cabinet assembly 100 of FIG. 1A-1C) significantly reduces the amount of noise that escapes from inside the assembly. These barriers may also be applied to the various surfaces of the assembly differently depending on the implementation. Referring momentarily back to FIGS. 1A-1C, in some implementations the noise absorbing barriers and the noise isolation barriers are applied to at least one surface of the equipment room 102, more preferably at least one interior surface of the equipment room 102, more preferably still all interior surfaces of the equipment room 102.

In other implementations, the noise isolation barriers are applied all interior surfaces of the equipment room 102, while a noise absorbing barrier is applied to one exterior surface of the equipment room 102. In other implementations the noise absorbing barriers and the noise isolation barriers are both applied to at least one surface of the cabinet fan module 106, more preferably at least one interior surface of the cabinet fan module 106, more preferably still all interior surfaces of the cabinet fan module 106. In still other implementations the noise absorbing barriers and the noise isolation barriers are both applied to all interior surfaces of the cabinet fan module 106 and the equipment room 102, while noise absorbing barriers are applied to all interior surfaces of the air inlet channel 104 and air outlet channels 108, 110.

This allows for compute devices like edge servers and HPC servers to be positioned in environments that are sensitive to noise, which has been conventionally unachievable without significantly reducing throughput of the computing device. However, embodiments included herein introduce implementations that are able to maintain desired airflow while also significantly reducing the noise footprint of the resulting system.

It should again be noted that while various portions of the compute cabinet assembly 100 have been depicted and/or described as being coupled to certain surfaces of the equipment room 102, this is in no way intended to be limiting. Rather, the different portions of the assembly may be implemented (e.g., positioned) differently. For instance, the air inlet channel 104 is depicted in the present embodiment as being directly coupled to a "bottom" surface of the equipment room 102 when positioned in an intended orientation. However, this is in no way intended to be limiting. The air outlet channels 108, 110 may be coupled to "top" and "bottom" surfaces of the assembly 100 while positioned in an intended orientation, and the air inlet channel 104 and cabinet fan module 106 positioned on opposite sides of the assembly 100 while in the same orientation.

Figure 3:
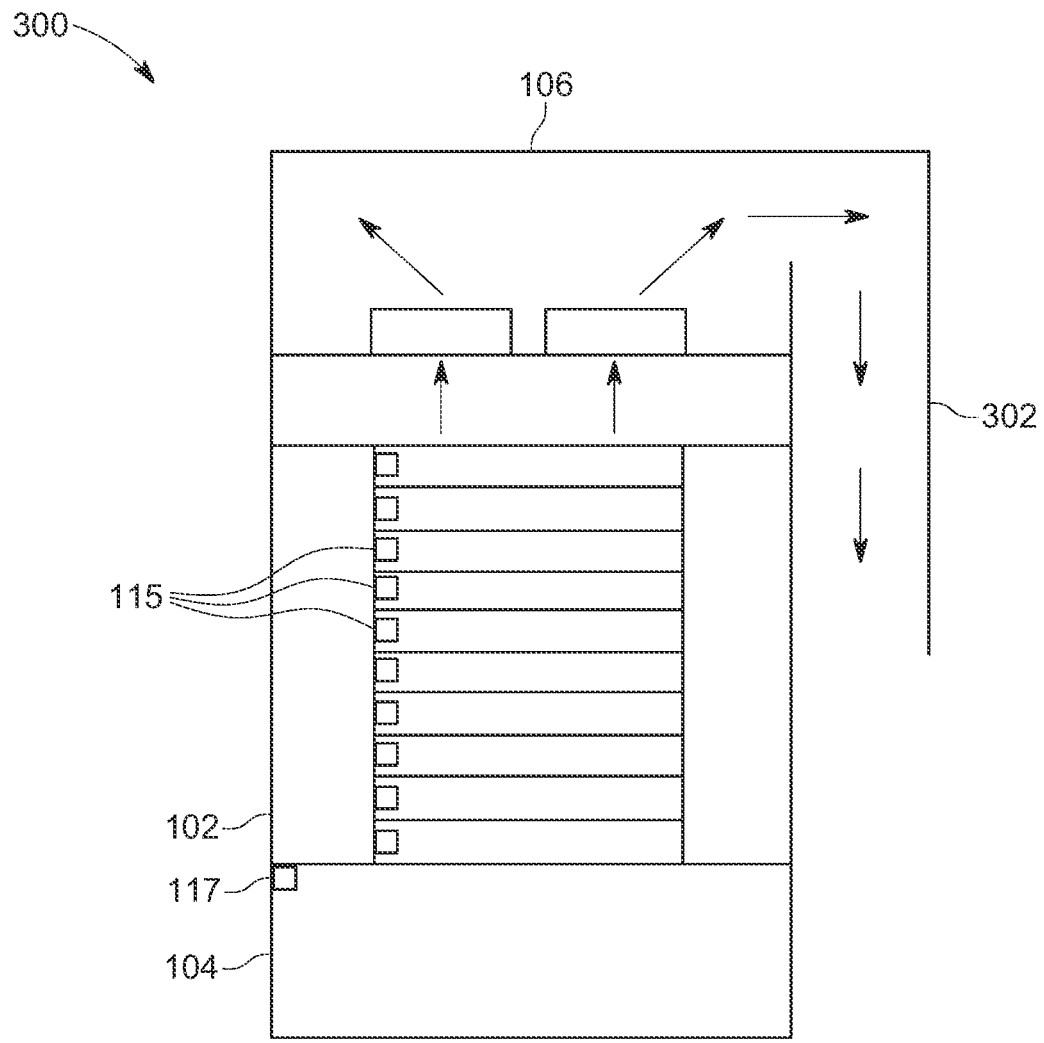
FIG. 3 is a vertical cross-sectional view of a compute cabinet assembly, according to certain aspects of the present disclosure.

Similarly, the number of portions the compute cabinet assembly 100 is shown as including is in no way intended to be limiting. For instance, in some implementations a compute cabinet assembly includes only one air outlet channel. Looking now to FIG. 3, a compute cabinet assembly 300 that provides cooling capacity and noise reduction is illustrated in accordance with one embodiment. Specifically, FIG. 3 illustrates a variation of the embodiment of FIGS. 1A-1C depicting an exemplary configuration of the air outlet channel 302. Accordingly, various components of FIG. 3 have common numbering with those of FIGS. 1A-1C.

As shown, the compute cabinet assembly 300 includes the equipment room 102 which is configured to implement electrical components therein. The air inlet channel 104 is also shown as being coupled to a first side of the equipment room 102. The compute cabinet assembly 300 also includes the cabinet fan module 106 coupled to a second side of the equipment room 102. Specifically, the cabinet fan module 106 is illustrated as being coupled directly to a top of the assembly 100. It follows that the air inlet channel 104 and cabinet fan module 106 are positioned on opposite sides of the compute cabinet assembly 300.

However, only one air outlet channel 302 is illustrated in the present implementation as being coupled to a side of the equipment room 102. This air outlet channel 302 is also positioned such that at least a portion of the cabinet fan module 106 is coupled thereto. For instance, an air outlet of the cabinet fan module 106 may connect directly to an inlet of the air outlet channel 302. The air outlet channel 302 is thereby preferably configured to direct airflow down the side of the equipment room 102 and away from the cabinet fan module 106, e.g., as shown.

As noted above, noise absorbing barriers and/or noise isolation barriers may also be coupled to any desired surfaces of these various portions of the assembly 300. For instance, noise absorbing barriers may be applied to all interior surfaces of the air inlet channel, the air outlet channel, the equipment room, and the cabinet fan module. Moreover, noise absorbing barriers may also be applied to all interior surfaces of the equipment room, and the cabinet fan module.

Figure 4A:
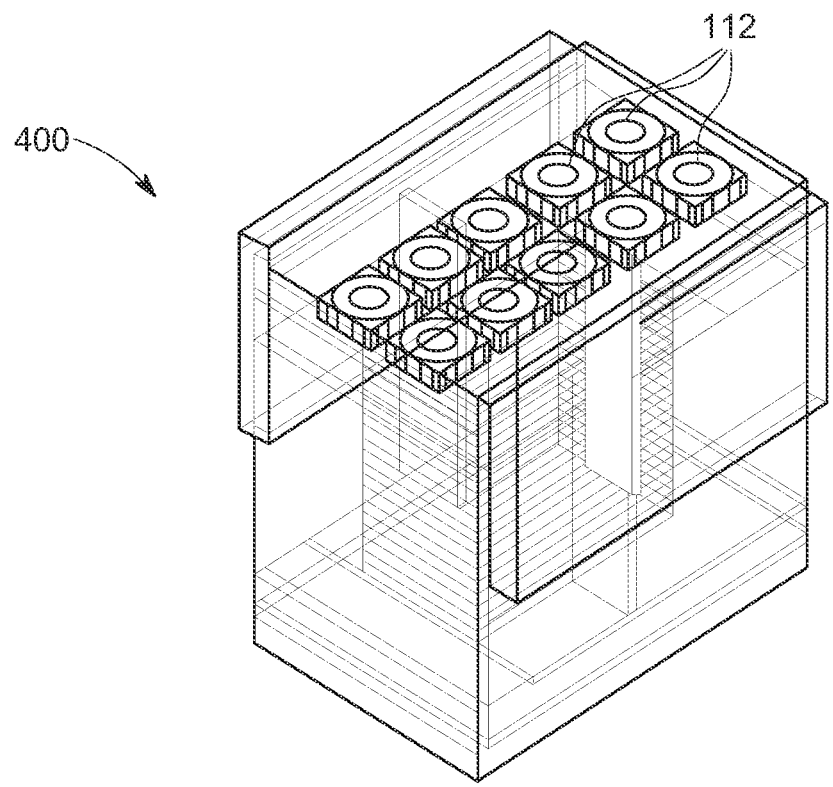
FIG. 4A is a perspective view of a compute cabinet assembly having electric fans positioned in a rectangular configuration, according to certain aspects of the present disclosure.
Figure 4B:
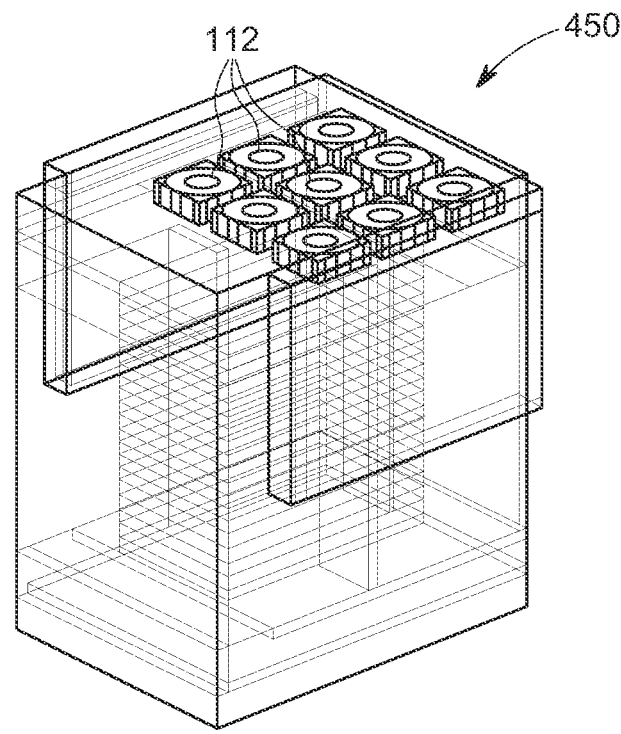
FIG. 4B is a perspective view of a compute cabinet assembly having electric fans positioned in a square configuration, according to certain aspects of the present disclosure.

Referring now to FIGS. 4A-4B, the electric fans are shown in different configurations. As previously mentioned, the cabinet fan module of a given compute cabinet assembly may include a plurality of electric fans (e.g., cabinet fans) therein. These fans may assist in creating an airflow that cools the various electrical components implemented in the assembly. Accordingly, the fans are preferably placed in a configuration that produces desirable airflow(s).

Looking specifically to FIG. 4A, the electric fans 112 are shown in a compute cabinet assembly 400 as being positioned in a rectangular configuration in the cabinet fan module 106. With respect to the present description, a "rectangular configuration" is intended to refer to a situation where each fan is positioned adjacent to each other such that blades in each electric fan rotate coplanar to each other.

While positioning the electric fans 112 in a rectangular configuration produces desirable airflow throughout the assembly 400, the electric fans 112 may again be positioned in different configurations. For instance, FIG. 4B shows the electric fans 112 positioned in the compute cabinet assembly 450 as being positioned in a square configuration. However, any desired configuration (e.g., pattern, shape, design, random organization, etc.) may be implemented.

It follows that various ones of the approaches included herein are able to significantly improve thermal capacity and reduce noise without limiting performance. In other words, the approaches herein are able to significantly improve the thermal regulation of compute cabinet assemblies like edge servers and HPC servers, while also reducing their noise profiles such that they may be place in locations having greater noise sensitivity than typical server warehouses. However, these improvements to thermal and noise regulation do not result in a corresponding reduction in performance, e.g., as typically experienced by conventional implementations. In fact, the Inventors have verified with testing, that some of the approaches described herein are able to support over 20 kW of heat dissipation combined with over 25 dBA of noise removal at the same time. Again, this has been conventionally unachievable.

According to some of these approaches, the heat and noise dissipation is achieved at least partially as a result of dividing the compute cabinet assembly into four portions (air inlet channel, air outlet channels, equipment room, and cabinet fan zone). Moreover, by positioning the air inlet channel at the bottom of the assembly, cold air is allowed to enter and absorbs the noise emitting from the components in the assembly. The air outlet channels are located on two sides of the equipment room, thereby allowing hot air to exit and absorb the noise emitting from the components in the assembly. The cabinet fan module includes various electric fans, and is positioned on the top of the equipment room to create sufficient airflow to cool the components in the assembly.

It follows that the improvements that are achieved by the various approaches included herein may be realized (e.g., experienced) in response to simply activating the electric fans and/or electrical components 103 in the equipment room 102. In other words, while the various physical portions of a compute cabinet assembly and/or the electrical components may vary depending on the implementation, they may be configured to create an airflow path in response to receiving instructions to do so.

Figure 5:
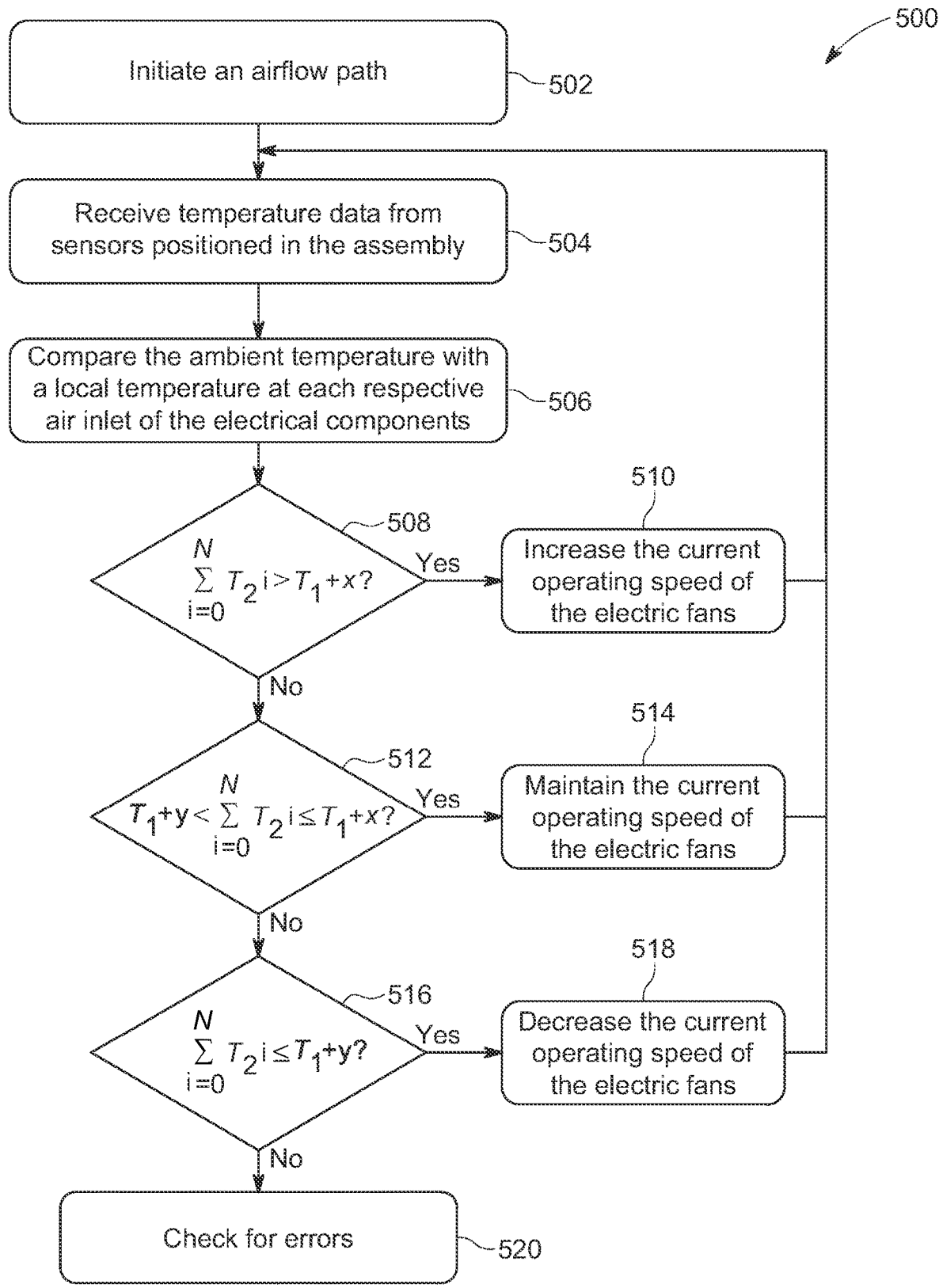
FIG. 5 is a flowchart of an example method for providing cooling capacity to a compute cabinet assembly, according to certain aspects of the present disclosure.

For example, FIG. 5 illustrates a method 500 for providing cooling capacity and noise reduction to a compute cabinet assembly as shown according to one embodiment. Specifically, the various operations included in method 500 are described with respect to a compute cabinet assembly having a similar configuration to the compute cabinet assembly 100 depicted in FIGS. 1A-1C. However, the method 500 may be performed in accordance with the present invention in any of the environments depicted in FIGS. 1A-4B, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in various embodiments, the method 500 may be partially or entirely performed by a controller, a processor, a computer, etc., or some other device having one or more processors therein. Thus, in some embodiments, method 500 may be a computer-implemented method. Moreover, the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 5, operation 502 of method 500 includes causing an airflow path to initiate at an inlet of an air inlet channel coupled to a first side of an equipment room. In other words, operation 502 may be achieved by activating one or more electric fans and/or electrical components in the equipment room. These fans and/or components may be activated in some approaches by sending one or more activation instructions to one or more controllers configured to operate the respective fans and/or components. In other implementations, operation 502 may be performed by a processor that is configured to operate the respective fans and/or components, and thereby the airflow path may be initiated by simply activating one or more motors therein. It follows that operation 502 includes causing electric fans in an equipment room to operate at a predetermined rotational speed. Depending on the approach, the rotational speed may be predetermined by a user, be preset by a manufacturer (e.g., based on product testing), predetermined by industry standards, etc.

While operation 502 includes causing the electric fans to operate at a predetermined rotational speed, in some approaches the rotational speed is actually determined based on current operating settings of an assembly. For instance, operation 502 may include causing the electric fans to rotate at a speed that is in a range having bounds defined by the current throughput of the servers in an equipment room of the assembly. According to an example, which is in no way intended to limit the invention, The electric fans may receive instructions to operate at a predetermined rotational speed that is between about 30% and about 80% of an average of the maximum operating speed values for the electric fans, more preferably between about 20% and about 90% of the average, but could be higher or lower depending on the implementation.

Operation 504 includes receiving temperature data from sensors positioned in the assembly. In some approaches, the temperature data is received from temperature sensors that are positioned in an air inlet or inlet channel of an assembly (e.g., see inlet 120 or air inlet channel 104 of FIG. 1C). Temperature sensors may also be positioned in the equipment room 102. For instance, a temperature sensor may be positioned adjacent to each air inlet of one or more servers implemented in the equipment room 102. These temperature sensors may thereby provide a temperature reading that identifies the temperature of the air as it enters each of the electrical components.

This temperature information may further be compared against temperature data received from one or more temperature sensors positioned in the air inlet or inlet channel of the assembly. Accordingly, operation 506 includes comparing the ambient temperature in the air inlet channel with a local temperature at an at least one air inlet of electrical component(s) implemented in the equipment room. In other words, operation 506 includes comparing the temperature of ambient air while in the air inlet channel (e.g., see air inlet channel 104 of FIG. 1C), with local (e.g., spot) temperature readings taken by one or more sensors positioned at an air inlet of an electrical component positioned in an equipment room of the assembly. For example, the local temperature readings may be received from temperature sensors positioned at air inlets of one or more respective servers (e.g., see electrical components 103 of FIG. 1C).

Proceeding to operation 508, a determination is made as to whether the local air temperature at the air inlet area is greater than the ambient air temperature in the air inlet channel. In other words, operation 508 includes determining whether a temperature ($T_2$) of the air being drawn into a given one of the servers implemented in a compute cabinet assembly is hotter than the temperature ($T_1$) of ambient air being drawn in from the surrounding environment. This increase in temperature may be attributed to backflow. Accordingly, operation 508 is able to effectively determine whether backflow is being experienced in a compute cabinet assembly, and take corrective action in response to determining that backflow is present. As shown, operation 508 may simply involve determining whether Equation 1 below is true for all values of "i" (for all servers).

$$\sum_{i=0}^{N} T_{2^i} > T_1 + x \qquad \text{Equation 1}$$

As noted above, a temperature sensor may be positioned adjacent to an air inlet of each server in the equipment room. Moreover, the variable "x" may be any desired value. For example, in some approaches x may be set to a value of 1, but could be any other desired value.

Method 500 includes proceeding to operation 510 in response to determining that the local air temperature at the air inlet of at least one of the electrical components is greater than the ambient air temperature in the air inlet channel plus some variable. There, operation 510 includes increasing the operating speed of the electric fans by a first predetermined amount. The operating speed of the electric fans may be increased in response to one or more commands, instructions, requests, etc. being sent to the electric fans and/or control modules (e.g., boards) electrically coupled thereto. Increasing the operating speed of the electric fans preferably increases the amount of airflow traveling through the assembly, thereby reducing the temperature at the air inlets of the electrical components.

The amount by which the operating speed of the electric fans is increased may vary depending on the implementation. For instance, in different approaches, the operating speed of the electric fans may be increased by an amount predetermined by a user, an administrator, based on a lookup chart, etc. However, it is preferred in some approaches that the operating speed is increased by a significant amount (e.g., about 10% of a maximum operating speed) in response to determining the inlet speed of at least one electrical component is greater than the inlet temperature. It follows that the operating speeds of the electric fans may be increased by any desired amount. It should also be noted that the operating speed of each electric fan may be adjusted by the same, a similar, or different amount compared to a remainder of the electric fans.

From operation 510, method returns to operation 504. There, additional temperature data may be received from the sensors positioned in the assembly. By receiving temperature data over time between adjustments that are made to the operating conditions of the electric fans, method 500 may be able to identify how adjustments made to the electric fans affect performance of the system as a whole. For instance, temperature information received from each temperature sensor may be averaged over time (e.g., every 1, 2, 3, 4, 5, 10, 15, 20, 30, 50, 100, 1000, etc., second interval) before returning to operation 506 to compare the updated temperatures.

Returning to operation 508, method 500 is shown proceeding to operation 512 in response to determining that the ambient air temperature in the air inlet channel plus some value is greater than the local air temperature at the air inlet of at each of the electrical components. There, operation 512 includes determining whether (i) the temperature at each of the air inlets of the electrical components are less than or equal to the ambient temperature in the air inlet channel plus a constant value, and (ii) the temperature at each of the air inlets of the electrical components are greater than the ambient temperature in the air inlet channel plus a constant value. In other words, operation 512 includes determining whether Equation 2 below is true for all values of "i" (for all servers).

$$T_1 + y < \sum_{i=0}^{N} T_{2^i} \leq T_1 + x \qquad \text{Equation 2}$$

As noted above, a temperature sensor may be positioned adjacent to an air inlet of each server in the equipment room. Moreover, either of the variables "x" and "y" may be any desired value. For example, in some approaches x and/or y may be set to a value of 1, but could be any other desired value, e.g., such as 0.75, 1.5, 2, 3, 4, 5, 10, 50, 100, 1000, etc. Moreover, the values of x and y may be the same, different, similar, correlated with each other (e.g., multiples of each other), etc.

Method 500 includes proceeding to operation 514 in response to determining that Equation 2 above has been satisfied for each of the servers. There, operation 514 includes maintaining the current operating speed of the electric fans. In other words, operation 514 includes refraining from adjusting the operating speed of any of the electric fans. From operation 514, method returns to operation 504. As noted above, additional temperature data may be received from the sensors positioned in the assembly over time. By receiving temperature data over time between adjustments that are made to the operating conditions of the electric fans, method 500 may be able to identify how adjustments made to the electric fans affect performance of the system as a whole.

For instance, temperature information received from each temperature sensor may be averaged over time. In some instances, the ambient temperature in the air inlet channel may be an average value calculated using the temperature data received from the temperature sensors positioned in the air inlet. Similarly, the temperature at each air inlet of the electrical components may be an average value of the temperature data received from the temperature sensor positioned at the respective air inlets. These values may be averaged (updated) as desired, e.g., every 1, 2, 3, 4, 5, 10, 15, 20, 30, 50, 100, 1000, etc., second interval, before returning to operation 506 to compare the updated temperatures.

Returning to operation 512, method 500 proceeds to operation 516 in response to determining that Equation 2 above has not been satisfied for one or more of the servers. There, operation 516 includes determining whether ambient temperature in the air inlet channel is greater than or equal to the local temperature at each of the air inlets of the electrical components plus a constant value. In other words, operation 516 includes determining whether Equation 3 below is satisfied for all of the servers.

$$\sum_{i=0}^{N} T_{2^i} \leq T_1 + y \qquad \text{Equation 3}$$

Method 500 includes proceeding to operation 518 in response to determining that Equation 3 above has been satisfied for each of the servers. There, operation 518 includes decreasing the current operating speed of the electric fans by a second predetermined amount. In other words, operation 518 includes slowing the electric fans in response to determining that an excess amount of air is being passed through the servers in the equipment room. However, method 500 may include checking for errors in response to determining that Equation 3 above has been not been satisfied for each of the servers. See optional operation 520.

It should be noted that the amount by which the operating speed of the electric fans is increased is preferably greater than the amount by which the operating speed of the electric fans is decreased. This is because it is desirable to increase the operating speed sufficiently to accommodate a current operating condition, while undesirable to reduce the operating speed by an excessive amount. For instance, the operating speed of the electric fans may be increased between about 3% and about 10% of a maximum operating speed in response to meeting a predetermined condition (e.g., see operation 508), could be higher or lower depending on the implementation. However, the operating speed may be decreased between about 1% and about 3% of the maximum operating speed in response to meeting another predetermined condition (e.g., see operation 516), but again, this could be a higher or lower percentage depending on the implementation.

It follows that various ones of the implementations included herein are desirably able to improve thermal capacity and reduce noise without limiting performance. In other words, the implementations herein are able to significantly improve the thermal regulation of compute cabinet assemblies like edge servers and HPC servers, while also reducing their noise profiles such that they may be place in locations having greater noise sensitivity than typical server warehouses. However, these improvements to thermal and noise regulation do not result in a corresponding reduction in performance, e.g., as typically experienced by conventional implementations.

According to some of these approaches, the heat and noise dissipation is achieved at least partially as a result of dividing the compute cabinet assembly into four portions (air inlet channel, air outlet channels, equipment room, and cabinet fan zone). Moreover, by positioning the air inlet channel at the bottom of the assembly, cold air is allowed to enter and absorbs the noise emitting from the components in the assembly. The air outlet channels are located on two sides of the equipment room, thereby allowing hot air to exit and absorb the noise emitting from the components in the assembly.

Furthermore, the cabinet fan module includes various electric fans, and is positioned on the top of the equipment room to create sufficient airflow to cool the components in the assembly. The electric fans may be controlled (e.g., as described in method 500 of FIG. 5) automatically regulate the ambient temperature with respect to the local temperature readings at server inlets. By regulating electric fan operating speeds in correlation to server activity, the implementations herein are desirably able to improve power consumption efficiency, while also maintaining desirable thermal characteristics for the physical components in an assembly.

Moreover, a processor or a processing element may be trained to regulate the operating settings of the electric fans using machine learning programs, including supervised and/or unsupervised machine learning. The machine learning program may employ a neural network, which may be a convolutional neural network, a deep learning neural network, or a combined learning module or program that learns in two or more fields or areas of interest. Machine learning may involve identifying and recognizing patterns in existing data in order to facilitate making predictions for subsequent data. Models may be created based upon example inputs in order to make valid and reliable predictions for novel inputs to the electric fan controllers.

Additionally or alternatively, the machine learning programs may be trained by inputting sample data sets or certain data into the programs, such as temperature data, processing power, operational throughput, and/or other types of information received from the servers. The machine learning programs may utilize deep learning algorithms that may be primarily focused on pattern recognition, and may be trained after processing multiple examples.

In supervised machine learning, a processing element may be provided with example inputs and their associated outputs, and may seek to discover a general rule that maps inputs to outputs, so that when subsequent novel inputs are provided the processing element may, based upon the discovered rule, accurately predict the correct output. In unsupervised machine learning, the processing element may be required to find its own structure in unlabeled example inputs. In one embodiment, machine learning techniques may be used to extract the relevant temperature information, corresponding server activity data, and/or other data.

It should be noted that the use of temperature data in the various approaches herein is in no way intended to be limiting. For instance, temperature data may be used to estimate computational throughput of corresponding electrical components. Thus, in other implementations, different types of information, e.g., such as an electrical current supply, processing throughput, data access times, etc., may be used to determine server activity. The amount of activity each server is experiencing may thereby be used to determine whether the current operating speed of the electric fans should be increased, decreased, or maintained, e.g., as described above.

Moreover, any of the approaches included herein may be implemented as a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should also be noted that, while various aspects of the implementations herein have been illustrated as including specific designs, orientations, numbers of components, etc., this is in no way intended to limit the invention. Rather, the implementations herein are presented for exemplary purposes only and may vary in design, orientation, number of components, etc., depending on the desired approach. It should also be noted that use of the terms "bottom", "lower", "top", "upper", etc., are in no way intended to be limiting. Any frames of reference used to describe the various implementations herein have been selected for illustrative purposes only and may be adjusted as desired.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A compute cabinet assembly for providing cooling capacity and noise reduction, the compute cabinet assembly comprising:

an equipment room configured to implement electrical components therein, the equipment room having a first side that is opposite a second side, the equipment room further having a third side extending between the first side and the second side;

an air inlet channel positioned adjacent to the first side of the equipment room;

a cabinet fan module positioned adjacent to the second side of the equipment room, the cabinet fan module having electric fans therein;

an air outlet channel positioned adjacent to the cabinet fan module and extending along the third side of the equipment room;

temperature sensors positioned in the air inlet channel and in the equipment room;

an electrical component having an air inlet area, the electrical component being positioned in the equipment room; and a processor for executing logic configured to:
cause, by the processor, the electric fans to operate at a predetermined speed;
receive, by the processor, temperature data from the temperature sensors;
compare, by the processor, an ambient temperature in the air inlet channel with a local temperature at the air inlet area;
in response to determining that the local temperature at the air inlet area is greater than the ambient temperature in the air inlet channel plus a constant value, increase, by the processor, the operating speed of the electric fans by a first predetermined amount; and
in response to determining that the ambient temperature in the air inlet channel plus a constant value is greater than or equal to the local temperature at the air inlet area, decrease, by the processor, the operating speed of the electric fans by a second predetermined amount.

2. The compute cabinet assembly of claim 1, wherein the logic is further configured to:
in response to determining that (i) the temperature at the air inlet area is less than or equal to the ambient temperature in the air inlet channel plus a constant value, and (ii) the temperature at the air inlet area is greater than the ambient temperature in the air inlet channel plus a constant value, maintain, by the processor, the operating speed of the electric fans.

3. The compute cabinet assembly of claim 1, wherein the ambient temperature in the air inlet channel is an average of the temperature data received from the temperature sensors positioned in the air inlet, wherein the temperature at the air inlet area is an average of the temperature data received from the temperature sensor positioned at the air inlet area.

4. The compute cabinet assembly of claim 3, wherein the average of the temperature data received from the temperature sensors positioned in the air inlet is updated every about 0.1 to about 10 seconds.

5. The compute cabinet assembly of claim 1, wherein the electrical component positioned in the equipment room includes a server, the server having at least one of the temperature sensors positioned at the corresponding air inlet area thereof.

6. The compute cabinet assembly of claim 5, wherein the equipment room is configured to receive a plurality of edge servers or performance computing servers therein.

7. The compute cabinet assembly of claim 1, wherein the first predetermined amount is greater than the second predetermined amount.

8. The compute cabinet assembly of claim 7, wherein the first predetermined amount is between about 3% and about 10%, wherein the second predetermined amount is between about 1% and about 3%.

9. The compute cabinet assembly of claim 1, wherein an airflow path (i) originates at the air inlet channel, (ii) extends through the equipment room and the cabinet fan module, and (iii) exits the compute cabinet assembly at the air outlet channel.

10. The compute cabinet assembly of claim 1, wherein the predetermined speed is between about 20% and about 80% of a maximum operating speed of the electric fans.

11. A method for providing cooling capacity and noise reduction to a compute cabinet assembly, the method comprising:
causing electric fans in the compute cabinet assembly to operate at a predetermined speed, the compute cabinet assembly further having:
an equipment room configured to implement electrical components therein, the equipment room having a first side that is opposite a second side, the equipment room further having a third side extending between the first side and the second side;
an air inlet channel positioned adjacent to the first side of the equipment room;
a cabinet fan module positioned adjacent to the second side of the equipment room, the cabinet fan module having the electric fans therein;
an air outlet channel positioned adjacent to the cabinet fan module and extending along the third side of the equipment room;
temperature sensors positioned in the air inlet channel and in the equipment room; and
an electrical component having an air inlet area, the electrical component being positioned in the equipment room;
receiving temperature data from the temperature sensors;
comparing an ambient temperature in the air inlet channel with a local temperature at the air inlet area;
in response to determining that the local temperature at the air inlet area is greater than the ambient temperature in the air inlet channel plus a constant value, increasing the operating speed of the electric fans by a first predetermined amount; and
in response to determining that the ambient temperature in the air inlet channel plus a constant value is greater than or equal to the local temperature at the air inlet area, decreasing the operating speed of the electric fans by a second predetermined amount.

12. The method of claim 11, further comprising:
in response to determining that (i) the temperature at the air inlet area is less than or equal to the ambient temperature in the air inlet channel plus a constant value, and (ii) the temperature at the air inlet area is greater than the ambient temperature in the air inlet channel plus a constant value, maintaining the operating speed of the electric fans.

13. The method of claim 11, wherein the ambient temperature in the air inlet channel is an average of the temperature data received from the temperature sensors positioned in the air inlet, wherein the temperature at the air inlet area is an average of the temperature data received from the temperature sensor positioned at the air inlet area.

14. The method of claim 11, wherein the electrical component positioned in the equipment room includes a server, the server having at least one of the temperature sensors positioned at the corresponding air inlet are thereof.

15. The method of claim 11, wherein the first predetermined amount is greater than the second predetermined amount.

16. The method of claim 15, wherein the first predetermined amount is between about 3% and about 10%, wherein the second predetermined amount is between about 1% and about 3%.

17. The method of claim 11, wherein an airflow path (i) originates at the air inlet channel, (ii) extends through the equipment room and the cabinet fan module, and (iii) exits the compute cabinet assembly at the air outlet channel.

18. A non-transitory computer program product for synchronously programming multiple memory modules, the computer program product comprising a computer readable storage medium having program instructions embodied therewith, the program instructions readable and/or executable by a processor to cause the processor to:
- cause, by the processor, electric fans in the compute cabinet assembly to operate at a predetermined speed, the compute cabinet assembly further having:
  - an equipment room configured to implement electrical components therein, the equipment room having a first side that is opposite a second side, the equipment room further having a third side extending between the first side and the second side;
  - an air inlet channel positioned adjacent to the first side of the equipment room;
  - a cabinet fan module positioned adjacent to the second side of the equipment room, the cabinet fan module having the electric fans therein;
  - an air outlet channel positioned adjacent to the cabinet fan module and extending along the third side of the equipment room;
  - temperature sensors positioned in the air inlet channel and in the equipment room; and
  - an electrical component having an air inlet area, the electrical component being positioned in the equipment room;
- receive, by the processor, temperature data from the temperature sensors;
- compare, by the processor, an ambient temperature in the air inlet channel with a local temperature at the air inlet area;
- in response to determining that the local temperature at the air inlet area is greater than the ambient temperature in the air inlet channel plus a constant value, increase, by the processor, the operating speed of the electric fans by a first predetermined amount; and
- in response to determining that the ambient temperature in the air inlet channel plus a constant value is greater than or equal to the local temperature at the air inlet area, decrease, by the processor, the operating speed of the electric fans by a second predetermined amount.

19. The non-transitory computer program product of claim 18, wherein the program instructions are readable and/or executable by the processor to cause the processor to:
- in response to determining that (i) the temperature at the air inlet area is less than or equal to the ambient temperature in the air inlet channel plus a constant value, and (ii) the temperature at the air inlet area is greater than the ambient temperature in the air inlet channel plus a constant value, maintain, by the processor, the operating speed of the electric fans.

20. The non-transitory computer program product of claim 18, wherein an airflow path (i) originates at the air inlet channel, (ii) extends through the equipment room and the cabinet fan module, and (iii) exits the compute cabinet assembly at the air outlet channel.

* * * * *